United States Patent

Higashi

(10) Patent No.: US 6,544,428 B1
(45) Date of Patent: Apr. 8, 2003

(54) METHOD FOR PRODUCING A MULTI-LAYER CIRCUIT BOARD USING ANISOTROPIC ELECTRO-CONDUCTIVE ADHESIVE LAYER

(75) Inventor: Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 308 days.

(21) Appl. No.: 09/669,729

(22) Filed: Sep. 26, 2000

Related U.S. Application Data

(62) Division of application No. 08/909,594, filed on Aug. 12, 1997, now Pat. No. 6,147,311.

(30) Foreign Application Priority Data

Aug. 12, 1996 (JP) .............................................. 8-212643

(51) Int. Cl.[7] ................................................. H05K 1/16
(52) U.S. Cl. .......................... 216/13; 174/260; 174/261; 174/264
(58) Field of Search ................................. 216/13, 15, 17, 216/18; 156/47, 50, 55, 60; 174/264

(56) References Cited

U.S. PATENT DOCUMENTS

| 5,461,775 | A |   | 10/1995 | Tanabe et al. .......... 174/259 X |
| 5,502,889 | A | * | 4/1996 | Casson et al. ................ 29/830 |
| 5,677,576 | A |   | 10/1997 | Akagawa .................... 257/785 |
| 5,744,758 | A |   | 4/1998 | Takenouchi et al. ........ 174/255 |

FOREIGN PATENT DOCUMENTS

| JP | 7-94868 | 4/1995 |
| JP | 8-330356 | 12/1996 |
| JP | 63-193883 | 12/1998 |

* cited by examiner

*Primary Examiner*—Randy Gulakowski
(74) *Attorney, Agent, or Firm*—Pennie & Edmonds LLP

(57) ABSTRACT

An anisotropic electro-conductive adhesive layer 14 including an adhesive 15 made of a thermosetting or thermoplastic resin containing electro-conductive particles 16 dispersed therein is formed on a basic circuit board 11 carrying a first circuit pattern 12. A second circuit pattern 18 is formed on the anisotropic electro-conductive adhesive layer 14. An end of the second circuit pattern 18 is curved into the anisotropic electro-conductive adhesive layer 14 to be electrically connected with first circuit pattern 12 via the electro-conductive particles 16. Thereby, the production process can be simplified and the production cost can be reduced. Also, the micro-circuit patterns can be arranged at a high density.

6 Claims, 5 Drawing Sheets

US 6,544,428 B1

METHOD FOR PRODUCING A MULTI-LAYER CIRCUIT BOARD USING ANISOTROPIC ELECTRO-CONDUCTIVE ADHESIVE LAYER

This is a division of application Ser. No. 08/909,594, filed Aug. 12, 1997 now U.S. Pat. No. 6,147,311.

BACKGROUND OF THE INVENTION

1. Field of the Invention

The present invention relates to a multilayer circuit board for a semiconductor device and a method for producing the same, particularly to a multilayer circuit board using an anisotropic electro-conductive adhesive layer and a method for producing the same.

2. Description of the Related Arts

When circuit patterns are formed in a multilayer manner while using substrates made of BT resin or the like, in general, the circuit patterns in the respective layers are electrically connected to each other via through-holes drilled through the laminated substrates and plated on the inner wall thereof with an conductive metal. FIG. 7 illustrates a circuit board formed by laminating resinous substrates 60. A through-hole 62 is bored through the resinous substrates 60, and a plated layer (for example, copper) 64 is formed on the inner wall thereof to electrically connect circuit patterns 66 on the respective layers with each other.

As described above, when the multilayer circuit board is produced, processes for forming the through-hole 62 and plating the inner wall of the through-hole 62 are necessary after the resinous substrates 60 are laminated and bonded together, which results in the lowering of production efficiency of the circuit board. Also, according to the above method wherein the plated layer 64 is formed on the inner wall of the through-hole to electrically connect the same with the circuit patterns 66 in the respective layers, it is necessary to ensure the spread of a plating solution all over the inner wall of the through-hole 62, and therefore, there is a limit in the reduction of a diameter of the through-hole. Generally, the lower limit of the diameter of the through-hole is about 0.3 mm, and the further integration of circuit patterns 66 is impossible.

To solve the above problems, Japanese Unexamined Patent Publication (Kokai) No. 7-94868 discloses a multilayer circuit board wherein circuit patterns in the respective layers are electrically connected with each other by using the electrical conductivity of an anisotropic electro-conductive adhesive. Such a multilayer circuit board is shown in FIG. 8, wherein a circuit pattern 72 is provided on one surface of a first substrate 70, and a connection land 74 is provided on the other surface thereof. When the first substrate 70 is bonded to a second substrate 70a having the same structure as that of the first substrate 70 by an anisotropic electro-conductive adhesive 80, the connection land 74 is electrically connected to a circuit pattern 72 provided on the second substrate 70a via electro-conductive particles 80a dispersed in the anisotropic electro-conductive adhesive 80. In this regard, the electrical connection between surfaces of the respective substrate 70, 70a, that is, that between the circuit pattern 72 and the connection land 74 is achieved by a through-hole 76 provided through the respective substrate 70, 70a in the thickness direction and filled with an electro-conductive paste 78.

The anisotropic electro-conductive adhesive 80 is used for bonding the substrates 70 and 70a with each other and is composed of a thermoplastic adhesive matrix having an electro-insulating property mixed with electro-conductive particles such as solder, and has a characteristic in that it becomes partially electro-conductive at a portion when it is pressed from both sides to evacuate the electro-insulating matrix therefrom, while maintaining the electro-insulating property in other portions.

However, since it is necessary to electrically connect the circuit patterns 72 provided on the upper and lower surfaces of the respective substrates 70 and 70a with the lands 74 as described above when the multilayer circuit board is formed while using the anisotropic electro-conductive adhesive 80, there is a problem in that processes are required for forming through-holes 76 in the substrates and for filling the electro-conductive adhesive 78 therein, resulting in the lowering of production efficiency.

Also, there has been still another problem in that the high density arrangement of circuit patterns 72 is restricted because of the through-holes 76.

SUMMARY OF THE INVENTION

Accordingly, an object of the present invention is to provide a multilayer circuit board which is inexpensive in production cost and capable of carrying micro-circuit patterns thereon at a high density, and a simple method for producing the same.

To achieve the above object, according to one aspect of the present invention, a multilayer circuit board using an anisotropic electro-conductive adhesive layer is provided, comprising a substrate on which a first circuit pattern is formed, an anisotropic electro-conductive adhesive layer formed on a surface of the substrate on which the first circuit pattern is provided, consisting of a thermosetting or thermoplastic resin adhesive containing electro-conductive particles dispersed therein, and a second circuit pattern formed on the anisotropic electro-conductive adhesive layer, wherein an end of the second circuit pattern is curved into the anisotropic electro-conductive adhesive layer to be closer to the substrate and electrically connected to the first circuit pattern via the electro-conductive particles.

Preferably, a through-hole is provided in the substrate at a position corresponding to an end of the first circuit pattern, to expose the end of the first circuit pattern for facilitating the connection of an external terminal therewith.

Preferably, the through-hole is filled with a solder and carries the external terminal which is a solder ball integral with the solder filling the through-hole.

According to another aspect of the present invention, a multilayer circuit board using an anisotropic electro-conductive adhesive layer is provided, comprising a substrate on which a first circuit pattern is formed, a first anisotropic electro-conductive adhesive layer formed on a surface of the substrate on which the first circuit pattern is provided, consisting of a thermosetting or thermoplastic resin adhesive containing electro-conductive particles dispersed therein, and a second circuit pattern formed on the first anisotropic electro-conductive adhesive layer, a second anisotropic electro-conductive adhesive layer formed on a surface of the first anisotropic electro-conductive adhesive layer on which the second circuit pattern is formed, and a third circuit pattern formed on the second anisotropic electro-conductive adhesive layer, wherein an end of the second circuit pattern is curved into the first anisotropic electro-conductive adhesive layer to be closer to the substrate and electrically connected to the first circuit pattern via the electro-conductive particles, and further an end of the third circuit pattern is curved into the second anisotropic electro-conductive adhesive layer to be closer to the substrate and electrically connected to the second circuit pattern via the electro-conductive particles.

In this case, preferably, the curved end of the second circuit pattern is overlaid with the curved end of the third circuit pattern to be brought into close contact with each other.

According to further aspect of the present invention, a method for producing a multilayer circuit board using an anisotropic electro-conductive adhesive layer is provided, comprising the steps of: a) preparing a substrate carrying a first circuit pattern thereon; b) forming an anisotropic electro-conductive adhesive layer consisting of a thermosetting or thermoplastic resin adhesive containing electro-conductive particles dispersed therein on a surface of the substrate carrying the first circuit pattern; c) forming an electro-conductive layer on the anisotropic electro-conductive adhesive layer, which is then processed to a second circuit pattern; and d) heating and softening the anisotropic electro-conductive adhesive layer to enhance the curvature of an end of the second circuit pattern into the anisotropic electro-conductive adhesive layer to be closer to the substrate whereby the second circuit pattern is electrically connected to the first circuit pattern via the electro-conductive particles.

In this case, the above steps b) to d) may be repeated to form three layers or more of circuit patterns overlaid with each other.

The anisotropic electro-conductive adhesive layer is preferably an epoxy type thermosetting resin containing metallic particles dispersed therein.

The metallic particle is made of at least one selected from a group consisting of solder, nickel or gold.

According to further more aspect of the present invention, a method for producing a multilayer circuit board using an anisotropic electro-conductive adhesive layer is provided, comprising the steps of: a) forming a conductive layer on an anisotropic electro-conductive adhesive film prepared by dispersing electro-conductive particles in an adhesive consisting of a thermosetting or thermoplastic resin; b) forming a second circuit pattern on the conductive layer; c) overlaying the anisotropic electro-conductive adhesive layer on a substrate carrying a first circuit pattern; and d) heating and softening the anisotropic electro-conductive adhesive layer to enhance the curvature of an end of the second circuit pattern into the anisotropic electro-conductive adhesive layer whereby the second circuit pattern is electrically connected to the first circuit pattern via the electro-conductive particles.

In this case, the above steps a) to c) may be repeated to form three layers or more of circuit patterns overlaid with each other and the step d) may be simultaneously carried out for all the layers.

DETAILED DESCRIPTION OF THE INVENTION

The present invention will be described in more detail below with reference to the preferred embodiments illustrated in the attached drawings.

Figure 1:
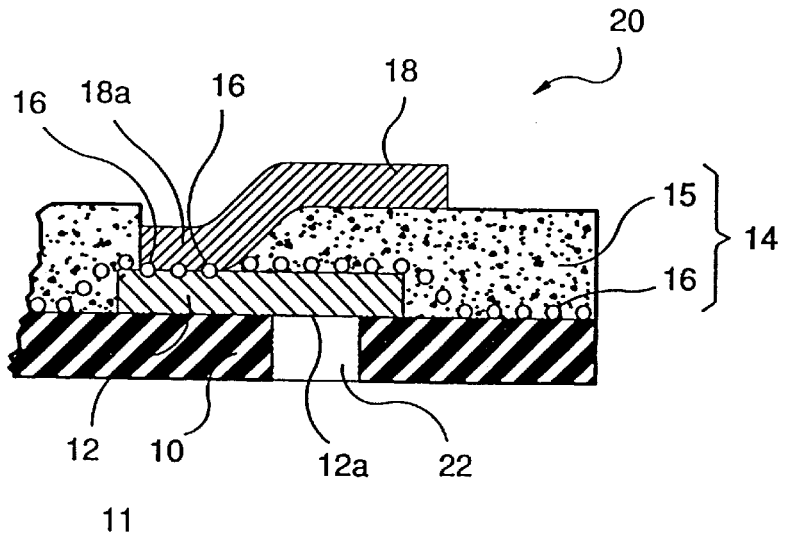
FIG. 1 is a side sectional view of one embodiment of a multilayer circuit board according to the present invention.
Figure 2:
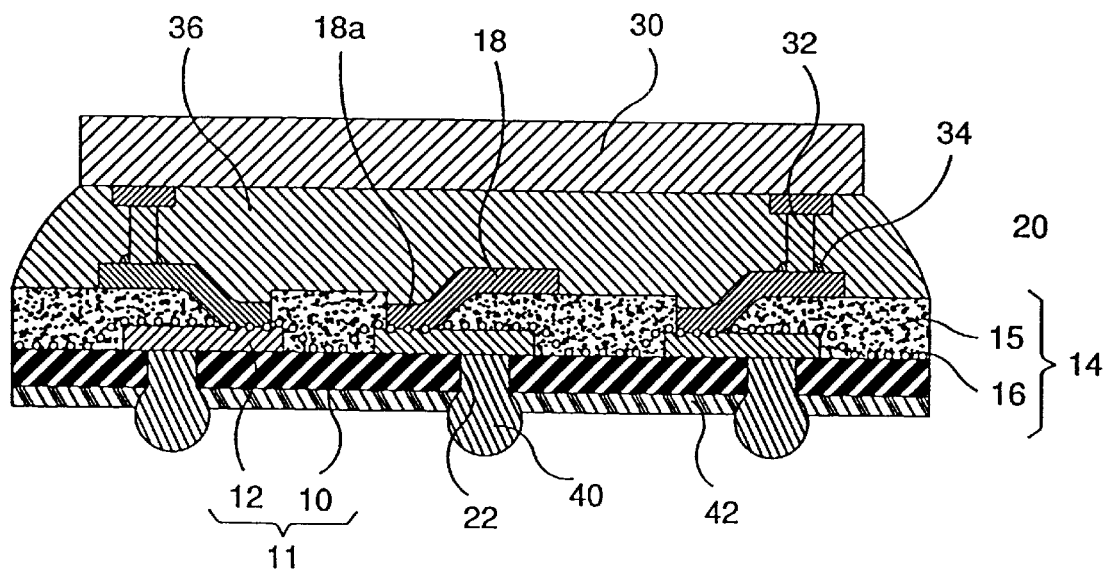
FIG. 2 is a side section view of the embodiment shown in FIG. 1 carrying a semiconductor chip thereon.

FIG. 1 is a side sectional view of one embodiment of a multilayer circuit board according to the present invention. FIG. 2 is a side sectional view of a semiconductor device using the multilayer circuit board.

A substrate 10 carries a first circuit pattern 12 thereon. The first circuit pattern 12 can be prepared, for example, by etching an electro-conductive foil such as a copper foil preliminarily adhered onto the substrate 10. A basic circuit board 11 is formed from the substrate 10 and the first circuit pattern 12.

An anisotropic electro-conductive adhesive layer 14 is provided on the basic circuit board 11, consisting of an adhesive 15 such as a thermosetting or thermoplastic resin containing electro-conductive particles 16 therein.

A second circuit pattern 18 can be prepared in the same manner as in the first circuit pattern 12, for example, by etching an electro-conductive foil such as a copper foil preliminarily adhered onto the anisotropic electro-conductive adhesive layer 14.

An end of the second circuit pattern 18 defines a connecting section 18a curved into the anisotropic electro-conductive adhesive layer 14 to be electrically connected with an end of the first circuit pattern 12 via the electro-conductive particles 16. That is, the connecting section 18a is a part of the second circuit pattern 18, which is pressed and curved, when the adhesive 15 (thermosetting or thermoplastic resin forming the anisotropic electro-conductive adhesive layer) is heated and softened, to push away the adhesive 15 of the anisotropic electro-conductive adhesive layer 14 and be in close contact with the first circuit pattern 12 via the electro-conductive particles 16, resulting in the electrical connection therewith.

A semiconductor device package 20 which is one embodiment of a multilayer circuit board is formed by the substrate 10, the first circuit pattern 12, the anisotropic electro-conductive adhesive layer 14, the second circuit pattern 18 and the connecting section 18a. The semiconductor device package 20 shown in FIG. 1 has a through-hole 22 at a position corresponding to the other end of the first circuit pattern 12 so that this end is exposed as an inner bottom 12a, with which an external terminal such as a solder ball or a solder pillar is suitably connected.

FIG. 2 shows a state wherein a semiconductor chip 30 is mounted to the above semiconductor device package 20. An electrode terminal 32 (for example, a gold bump) provided in the semiconductor chip 30 is electrically connected to the second circuit pattern 18 by a connecting material (for example, a solder 34), whereby the semiconductor chip 30 is connected to the second circuit pattern 18 formed in the semiconductor device package 20.

Also, a solder ball 40 is connected to the inner bottom 12a of the first circuit pattern 12 via a solder filled in the through-hole 22. Since the solder ball 40 is formed as an external terminal as described above, it is possible to suitably mount the semiconductor device.

In this regard, an underfill layer 36 made of an epoxy type resin is provided for protecting a connecting part of the electrode terminal of the semiconductor chip and enhancing the insulating property. The underfill material is injected by a potting, while taking a care so that the back side (upper surface in the drawing) of the semiconductor chip 30 is not sealed by the underfill material but exposed outside for enhancing the heat-dissipation. Also, a solder-resist layer 42 is provided for enhancing the insulating property.

Figure 3:
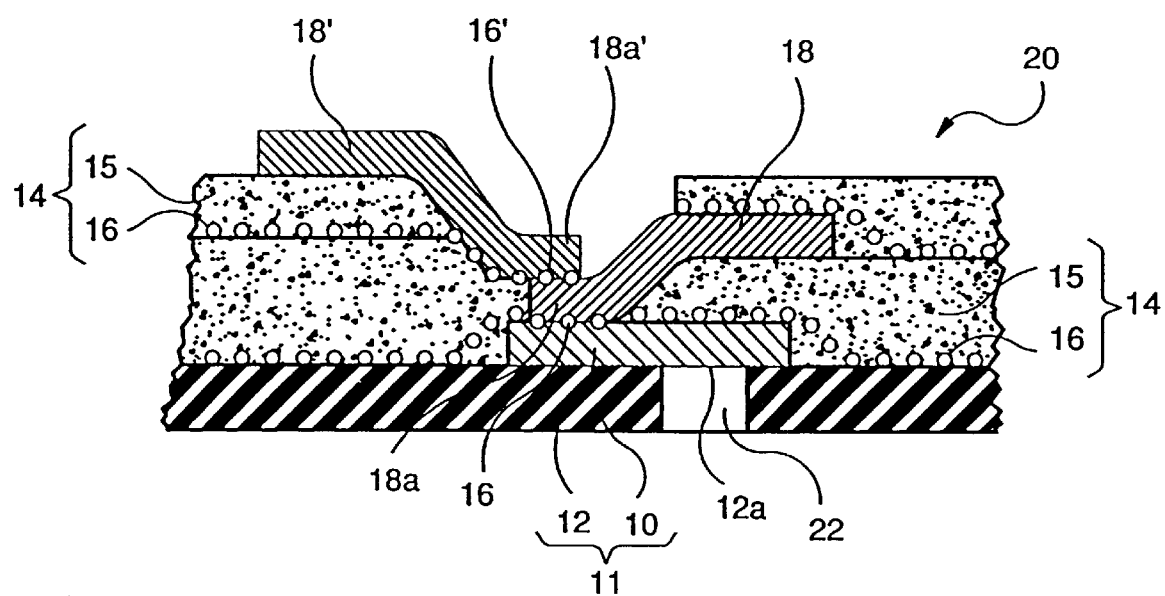
FIG. 3 is a side sectional view of another embodiment of a multilayer circuit board according to the present invention.

FIG. 3 is a side sectional view of another embodiment of a multilayer circuit board according to the present invention. In this embodiment, a third circuit pattern 18' is overlaid on the second circuit pattern 18 shown in FIG. 1. Specifically, an anisotropic electro-conductive adhesive layer 14' consisting of an adhesive 15' containing electro-conductive particles 16' dispersed therein is formed on the anisotropic electro-conductive adhesive layer 14 carrying the second circuit pattern 18 shown in FIG. 1, and an electro-conductive foil such as a copper foil is adhered onto the anisotropic electro-conductive adhesive layer 14', which foil is then etched to form a third circuit pattern 18'. In the same manner as in the second circuit pattern 18, an end 18'a of the third circuit pattern 18' is curved into the anisotropic electro-conductive adhesive layer 14' to be close contact with the end 18a of the second circuit pattern 18 via the electro-conductive particles 16' to be electrically connected thereto. In this regard, simultaneously with pressing the end 18'a of the third circuit pattern 18' to electrically connect the same with the end 18a of the second circuit pattern 18, the end 18a of the second circuit pattern 18 may be connected with the first circuit pattern 12.

As stated above, according to the present invention, the end of the second circuit pattern is curved into the anisotropic electro-conductive adhesive layer to be electrically connected with the first circuit pattern via the electro-conductive particles. Accordingly, it is unnecessary to provide a through-hole as in the prior art, whereby the process for producing the multilayer circuit board can be simplified. This results in the improvement in the production efficiency and the reduction in the production cost. Also, the arrangement of micro-circuit patterns becomes possible due to the elimination of through-hole.

Next, the present invention will be described in further more detail below with reference to some embodiments.

Materials and shapes of the basic circuit board 11 carrying the first circuit pattern 12 on the substrate 10 are not restricted and may be a sheet-like or a reel-shaped substrate such as FPC (flexible printed circuit) or TAB, PCB (printed circuit board) formed of a BT resin or the like, or a ceramic board.

The anisotropic electro-conductive adhesive layer 14 may be formed by bonding a sheet-like anisotropic electro-conductive adhesive film (ACF) onto the basic circuit board 11 or coating an adhesive 15 containing electro-conductive particles 22 dispersed therein.

The sheet-like anisotropic electro-conductive adhesive film may consist of a thermosetting adhesive (such as epoxy resin) or a thermoplastic adhesive (such as polyolefin resin or polyimide resin) containing electro-conductive particles 16 dispersed therein to form a thin layer. The electro-conductive particles 16 have a uniform size (for example, 5 $\mu$m or less, preferably 3 $\mu$m or less) and are arranged to form a single layer on one side of the adhesive layer 15 (opposite to the surface carrying the conductive layer) at a generally constant pitch. The electro-conductive particle may be a solder ball, a nickel ball or a gold-plated nickel or resinous ball. In general, a thickness of the anisotropic electro-conductive adhesive film is in a range from about 10 $\mu$m to about several tens of $\mu$m. When the anisotropic electro-conductive adhesive film is formed by using a thermosetting resin, the electro-conductive layer is preferably formed while the thermosetting resin is in a semi-hardened state (B-stage wherein the cross-linking of the thermosetting resin has not yet been completed). In this regard, the anisotropic electro-conductive adhesive film wherein the thermosetting resin is in a semi-hardened state is overlaid onto the basic circuit board. When the anisotropic electro-conductive adhesive film is heated thereafter, the cross-linking reaction proceeds to suitably bond the same with the basic circuit board, and finally the hardening of the thermosetting resin is completed.

The first circuit pattern 12 and the second circuit pattern 18 are made, for example, of a copper foil. If the electro-conductive particle 16 is made of a nickel ball, the electro-conductive particle 16 is nipped between the first circuit pattern 12 and the second circuit pattern 18 and embedded into both the patterns to favorably electrically connect the both with each other. Also, the electro-conductive particle 16 is operated as a wedge to ensure the mechanical connection between both the patterns. Further, the electro-conductive particle 16 interposed between both the circuit patterns 12 and 18 while being embedded thereinto is operated to absorb the variance in thickness of both the circuit patterns 12 and 18 to ensure the electric connection therebetween. That is, while the connecting parts of the first and second circuit patterns 12 and 18 do not form an integral body as in an alloy, the both are bonded to be in close contact with each other to have a low electric resistance.

Also, when a solder particle is used as the electro-conductive particle 16, the particle melts, due to the heat and pressure applied when the second circuit pattern 18 is curved to be connected with the first circuit pattern 12, to ensure the connection between both the circuit patterns.

Next, one embodiment of a method for the production of a semiconductor device will be described with reference to FIGS. 4(a) to 4(e) illustrating the sequential steps thereof.

Figure 4A:
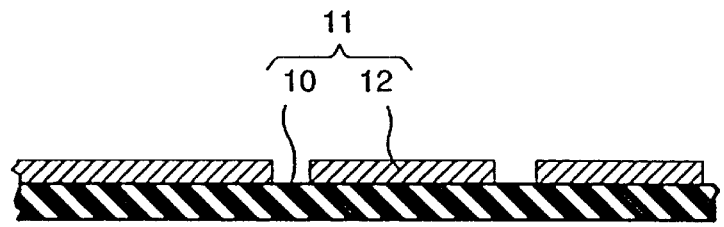
FIGS. 4(a) to 4(e) illustrate the steps of the production of the multilayer circuit board according to the present invention.

First, a basic circuit board 11 is prepared, which consists of a substrate 10 and a first circuit pattern 12 formed by etching an electro-conductive layer of a copper foil or others bonded onto the substrate 10 (see FIG. 4(a)).

Figure 4B:
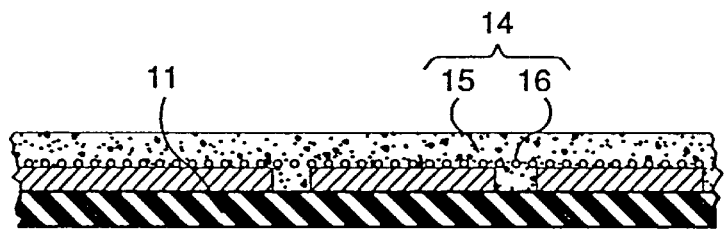

Then, the anisotropic electro-conductive adhesive layer 14 is formed on the basic circuit board 11 including the first circuit pattern 12 formed on the substrate 10 (see FIG. 4(b)).

Figure 4C:
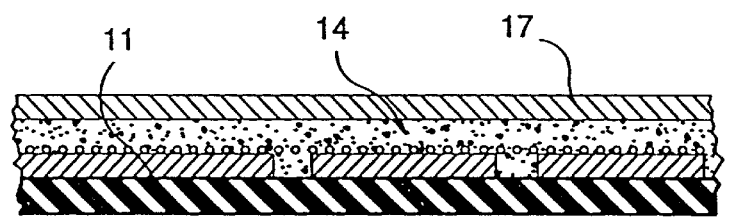
Figure 4D:
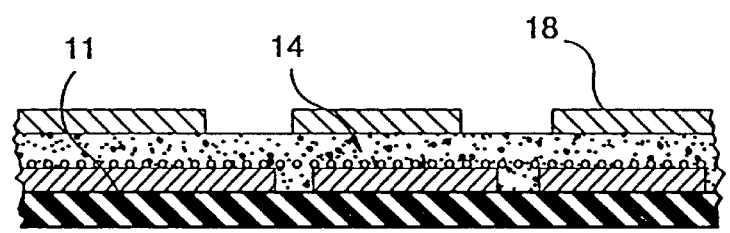
Figure 4E:
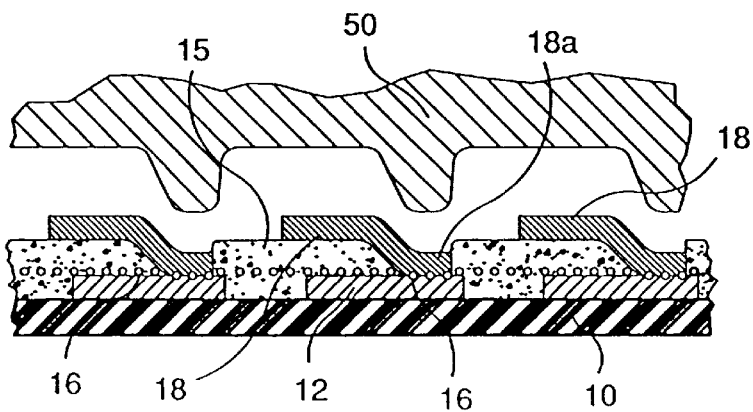

Then, an electro-conductive layer is formed on the anisotropic electro-conductive adhesive layer 14, for example, by adhering a copper foil 17 thereon (see FIG. 4(c)) which is etched after the patterning to form the second circuit pattern 18 (see FIG. 4(d)).

In this regard, the copper foil 17 may be preliminarily adhered onto the sheet-like anisotropic electro-conductive adhesive film which is then overlaid (adhered) onto the first circuit pattern 12 provided on the substrate 10 to form the anisotropic electro-conductive adhesive layer 14 and the conductive layer. Thereby, it is possible to improve the production efficiency.

Also, after the second circuit pattern 18 has been formed by patterning and etching the conductive layer (such as the copper foil 17) carried on the anisotropic electro-conductive adhesive film, the anisotropic electro-conductive adhesive film may be overlaid onto the substrate. According to this process, since the patterning and etching of the conductive layer can be preliminarily and separately carried out to prepare the second circuit pattern on the anisotropic electro-conductive adhesive film which is then adhered to the substrate, it is possible to further improve the production efficiency.

Thereafter, the anisotropic electro-conductive adhesive layer 14 is heated and softened to enhance the curvature of the end of the second circuit pattern 18 into the anisotropic electro-conductive adhesive layer 14 whereby the second circuit pattern 18 is electrically connected to the end of the first circuit pattern 12 via the electro-conductive particles 16. That is, the connecting section 18a which is a part of the second circuit pattern 18 is pressed and curved in the thickness-wise direction by a hot-press head 50 to push away the softened adhesive 15 to be electrically connected to the first circuit pattern 12 via the electro-conductive particles 16 (see FIG. 4(e)).

The anisotropic electro-conductive adhesive layer 14 is softened, for example, at a temperature in a range from 180 to 200° C. when being pressed by the hot-press head for a period in a range from 20 to 30 seconds, thus being connected to the pattern on the substrate 10.

The adhesive 15 contracts when softened, and hardens to pull the first and second circuit patterns 12, 18 closer to each other, whereby the electrical connection therebetween is maintained in a favorable state.

Figure 5:
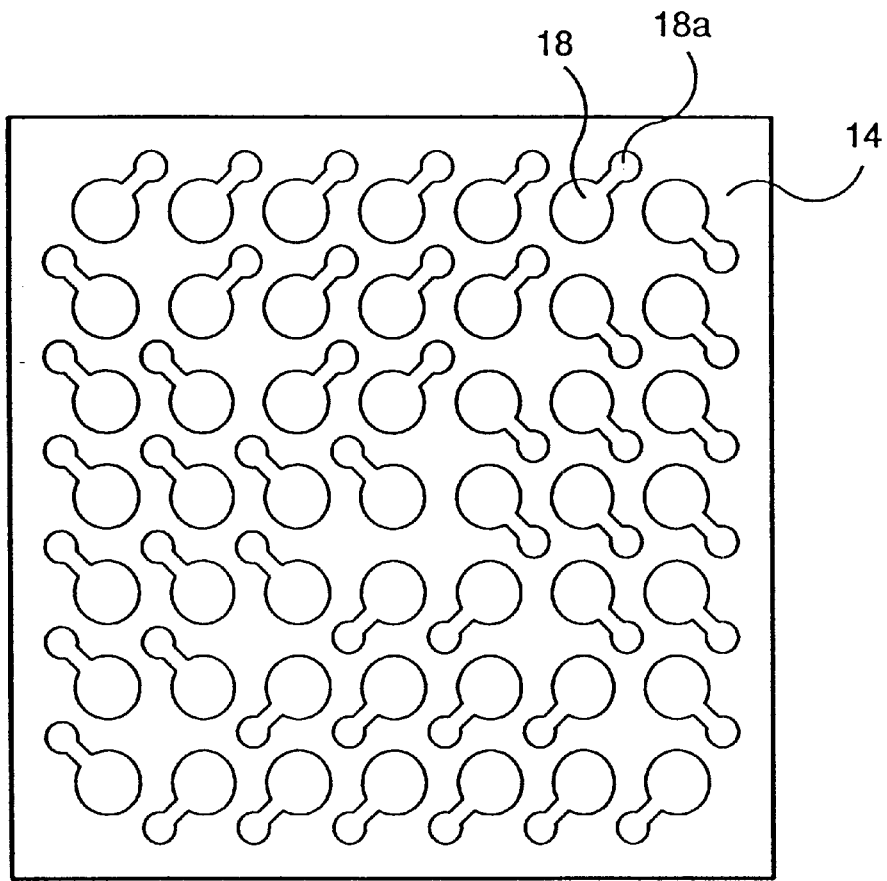
FIG. 5 is a plan view of a multilayer circuit board formed by a method according to the present invention.

FIG. 5 shows in a plan view a multilayer circuit board produced by the above method.

The connecting section 18a forms a recess by the pressure, and the second circuit pattern 18 is shaped to form a land for the connection with an element to be mounted. A surface of the multilayer circuit board carrying the second circuit pattern 18 including the connecting section 18a is covered with a solder resist so that the land-shaped electrode terminal-connecting part is exposed, for the purpose of protecting the connecting section and enhancing the electro-insulating property thereof.

The multilayer circuit board thus produced is usable for forming a semiconductor device carrying an element having an outer size substantially the same as that of the former which is a so-called chip-size package.

A shape of the hot-press head 50 is not limited to a simple pin form, but may be a knife-edge form extending in one direction. That is, the hot-press head 50 may be optional provided so that it could press the connecting section 18a to connect the same with the first circuit pattern 12 without causing the short-circuit between other portions of the second circuit pattern 18 and the first circuit pattern 12. If the circuit patterns are arranged on the substrate in an array form as shown in FIG. 5, the hot-press head 50 of a knife-edge form is preferably used.

Figure 6:
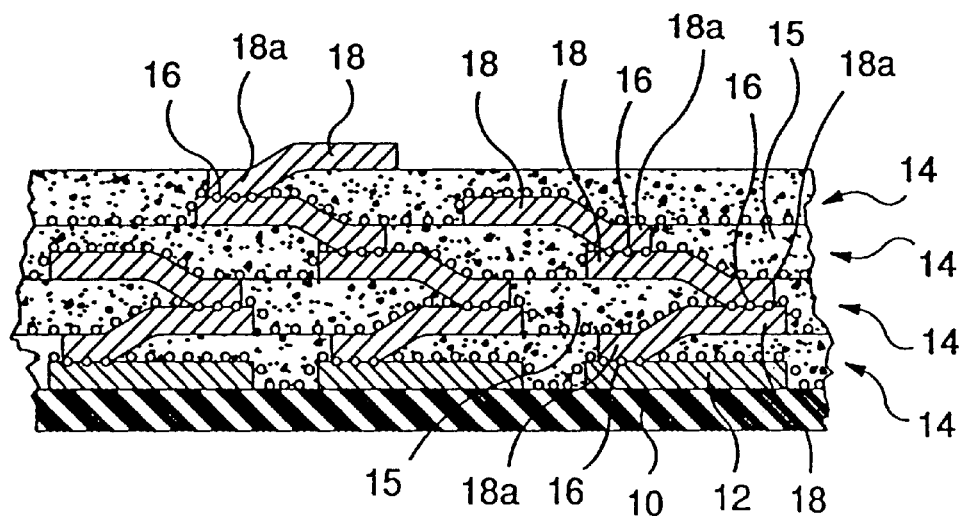
FIG. 6 is a side sectional view of a further embodiment of a multilayer circuit board according to the present invention.
Figure 7:
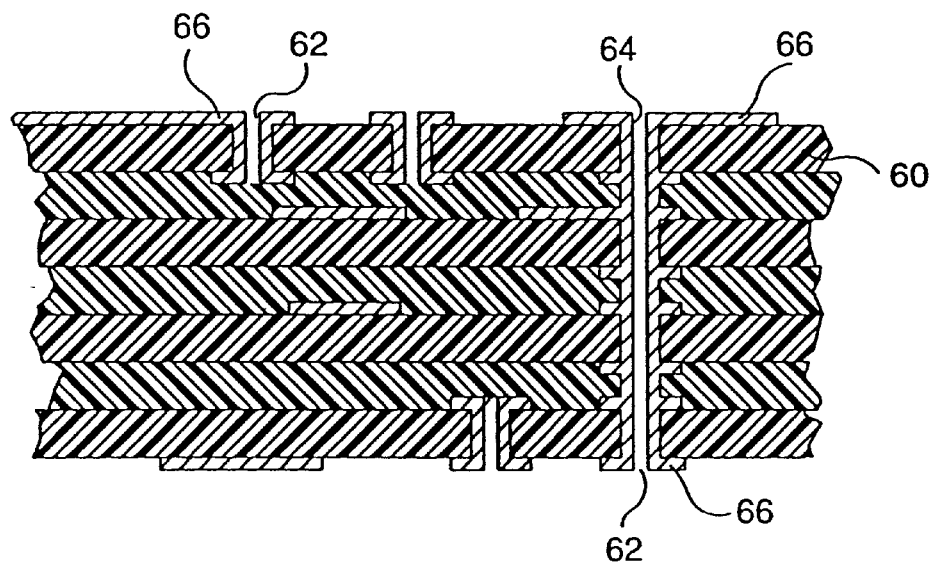
FIG. 7 is a side sectional view of a prior art multilayer circuit board.
Figure 8:
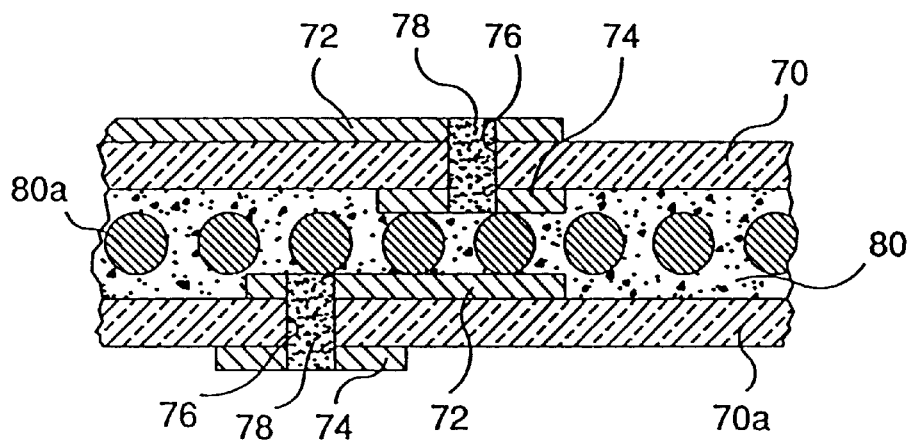
FIG. 8 is a side sectional view of another prior art multilayer circuit board.

Of course, the above production method can be repeated when circuit patterns are overlaid in three layers or more, whereby a multilayer circuit board is readily obtainable as shown in FIG. 6.

In this regard, to prevent the electric circuit precedently overlaid from causing the wire-breakage, a thermosetting resin which does not soften when heated again is preferably used as the adhesive 15 for the anisotropic electro-conductive adhesive layer 14. Thus, the adhesive once hardened does not soften by heat applied when the next layer is formed to ensure the reliable electrical connection between the respective layers, whereby the multilayer circuit board of three layers or more is suitably obtainable.

To flatten the slight concave in the bonding area caused by the curvature of the second circuit pattern 18 when the third circuit pattern is formed, a resin is preferably coated on the substrate after the second circuit pattern 18 has been formed to flatten the substrate surface, and thereafter, the third circuit pattern is provided.

When three or more layers are overlaid in a manner as mentioned above, it is, of course, possible to electrically connect the circuit patterns in the respective layers with each other at the same position as shown in FIG. 3. In this case, if there is no risk of wire-breakage in the precedently overlaid electric circuit, the circuit patterns in the respective layers may be simultaneously pressed together by a hot-press head or the like to electrically connect them with each other at once.

The above-mentioned first circuit pattern 12 or the second circuit pattern 18 may, of course, be a ground layer (GND) and a power layer (PWR), respectively.

As stated above, the present invention was explained with reference to the preferred embodiments, which should not be limited thereto but includes various changes and modifications without departing from the spirit of the invention.

What is claimed is:

1. A method for producing a multilayer circuit board using an anisotropic electro-conductive adhesive layer, comprising the following steps of:

a) preparing a substrate carrying a first circuit pattern thereon;

b) forming an anisotropic electro-conductive adhesive layer consisting of a thermosetting or thermoplastic resin adhesive containing electro-conductive particles dispersed therein on a surface of the substrate carrying the first circuit pattern;

c) forming an electro-conductive layer on the anisotropic electro-conductive adhesive layer, which is then processed to a second circuit pattern; and d) heating and softening the anisotropic electro-conductive adhesive layer to enhance the curvature of an end of the second circuit pattern into the anisotropic electro-conductive adhesive layer to be closer to the substrate whereby the second circuit pattern is electrically connected to the first circuit pattern via the electro-conductive particles.

2. A method for producing a multilayer circuit board as defined by claim 1, wherein the above steps b) to d) are repeated to form three layers or more of circuit patterns overlaid with each other.

3. A method for producing a multilayer circuit board as defined by claim 2, wherein the anisotropic electro-conductive adhesive layer is an epoxy type thermosetting resin containing metallic particles dispersed therein.

4. A method for producing a multilayer circuit board as defined by claim 2, wherein the metallic particle is made of at least one selected from a group consisting of solder, nickel or gold.

5. A method for producing a multilayer circuit board using an anisotropic electro-conductive adhesive layer is provided, comprising the steps of:

a) forming a conductive layer on an anisotropic electro-conductive adhesive film prepared by dispersing electro-conductive particles in an adhesive consisting of a thermosetting or thermoplastic resin;

b) forming a second circuit pattern on the conductive layer;

c) overlaying the anisotropic electro-conductive adhesive layer on a substrate carrying a first circuit pattern; and d) heating and softening the anisotropic electro-conductive adhesive layer to enhance the curvature of an end of the second circuit-pattern into the anisotropic electro-conductive adhesive layer whereby the second circuit pattern is electrically connected to the first circuit pattern via the electro-conductive particles.

6. A method for producing a multilayer circuit board as defined by claim 5, wherein the above steps a) to c) may be repeated to form three layers or more of circuit patterns overlaid with each other and the step d) may be simultaneously carried out for all the layers.

* * * * *